(12) United States Patent
Carta et al.

(10) Patent No.: US 9,496,421 B2
(45) Date of Patent: Nov. 15, 2016

(54) SOLDERABLE TOP METAL FOR SILICON CARBIDE SEMICONDUCTOR DEVICES

(75) Inventors: Rossano Carta, Turin (IT); Laura Bellemo, Turin (IT); Luigi Merlin, Turin (IT)

(73) Assignee: SILICONIX TECHNOLOGY C.V., Singapore (SG)

( * ) Notice: Subject to any disclaimer, the term of this patent is extended or adjusted under 35 U.S.C. 154(b) by 796 days.

(21) Appl. No.: 12/166,309

(22) Filed: Jul. 1, 2008

(65) Prior Publication Data

US 2008/0286968 A1 Nov. 20, 2008

Related U.S. Application Data

(63) Continuation of application No. 11/255,021, filed on Oct. 20, 2005, now Pat. No. 7,394,158.

(60) Provisional application No. 60/620,756, filed on Oct. 21, 2004.

(51) Int. Cl.
*H01L 23/31* (2006.01)
*H01L 29/872* (2006.01)
(Continued)

(52) U.S. Cl.
CPC ........ *H01L 29/872* (2013.01); *H01L 23/3192* (2013.01); *H01L 24/05* (2013.01); *H01L 24/34* (2013.01); *H01L 29/47* (2013.01); *H01L 24/12* (2013.01); *H01L 24/15* (2013.01); *H01L 29/0619* (2013.01); *H01L 29/1608* (2013.01); *H01L 29/402* (2013.01); *H01L 29/417* (2013.01); *H01L 2224/0401* (2013.01); *H01L 2224/0558* (2013.01); *H01L 2224/05639* (2013.01); *H01L 2924/00013* (2013.01); *H01L 2924/014* (2013.01); *H01L 2924/01005* (2013.01); *H01L 2924/0105* (2013.01); *H01L 2924/01006* (2013.01); *H01L 2924/01007* (2013.01); *H01L 2924/01013* (2013.01); *H01L 2924/01014* (2013.01); *H01L 2924/01015* (2013.01); *H01L 2924/01022* (2013.01); *H01L 2924/01023* (2013.01); *H01L 2924/01024* (2013.01);
(Continued)

(58) Field of Classification Search
CPC ..... H01L 24/10; H01L 24/11; H01L 23/485; H01L 23/3228; H01L 29/417
USPC ................ 257/762, 736, 680, E21.159, 737; 438/612–615, 683, 685, 687, 410, 141
See application file for complete search history.

(56) References Cited

U.S. PATENT DOCUMENTS 4,036,672 A 7/1977 Kobayashi
4,206,540 A 6/1980 Gould
(Continued)

FOREIGN PATENT DOCUMENTS

DE 19840032 11/1999
DE 10002362 8/2001
(Continued)

OTHER PUBLICATIONS

International Search Report for PCT/US05/38118 dated Feb. 6, 2007.

*Primary Examiner* — Nathan W Ha

(57) ABSTRACT

A silicon carbide device includes at least one power electrode on a surface thereof, a solderable contract formed on the power electrode, and at least one passivation layer that surrounds the solderable contact but is spaced from the solderable contract, thereby forming a gap.

20 Claims, 13 Drawing Sheets

(51) Int. Cl.
*H01L 29/47* (2006.01)
*H01L 23/00* (2006.01)
*H01L 29/06* (2006.01)
*H01L 29/16* (2006.01)
*H01L 29/40* (2006.01)
*H01L 29/417* (2006.01)

(52) U.S. Cl.
CPC ........... *H01L2924/01028* (2013.01); *H01L 2924/01033* (2013.01); *H01L 2924/01047* (2013.01); *H01L 2924/01055* (2013.01); *H01L 2924/01079* (2013.01); *H01L 2924/01082* (2013.01); *H01L 2924/05042* (2013.01); *H01L 2924/10272* (2013.01); *H01L 2924/1306* (2013.01); *H01L 2924/13032* (2013.01); *H01L 2924/13062* (2013.01); *H01L 2924/13091* (2013.01)

(56) References Cited

U.S. PATENT DOCUMENTS

| | | | | |
|---|---|---|---|---|
| 4,648,175 | A | 3/1987 | Metz, Jr. et al. | |
| 4,796,084 | A * | 1/1989 | Kamasaki et al. | 257/749 |
| 4,862,244 | A | 8/1989 | Yamagishi | |
| 4,990,994 | A | 2/1991 | Furukawa et al. | |
| 5,003,372 | A | 3/1991 | Kim et al. | |
| 5,047,833 | A * | 9/1991 | Gould | 257/772 |
| 5,113,237 | A | 5/1992 | Stengl | |
| 5,233,215 | A | 8/1993 | Baliga | |
| 5,323,040 | A | 6/1994 | Baliga | |
| 5,362,975 | A | 11/1994 | von Windheim et al. | |
| 5,384,470 | A | 1/1995 | Tachibana et al. | |
| 5,527,745 | A | 6/1996 | Dixit et al. | |
| 5,689,128 | A | 11/1997 | Hshieh et al. | |
| 5,712,502 | A | 1/1998 | Mitlehner et al. | |
| 5,747,831 | A | 5/1998 | Loose et al. | |
| 5,753,938 | A | 5/1998 | Thapar et al. | |
| 5,789,311 | A | 8/1998 | Ueno et al. | |
| 5,801,836 | A | 9/1998 | Bakowski et al. | |
| 5,914,500 | A | 6/1999 | Bakowski et al. | |
| 5,915,179 | A | 6/1999 | Etou et al. | |
| 5,932,894 | A | 8/1999 | Bakowski et al. | |
| 5,977,605 | A | 11/1999 | Bakowsky et al. | |
| 6,040,237 | A | 3/2000 | Bakowski et al. | |
| 6,040,600 | A | 3/2000 | Uenishi et al. | |
| 6,040,617 | A | 3/2000 | Patel | |
| 6,100,572 | A | 8/2000 | Kinzer | |
| 6,150,246 | A | 11/2000 | Parsons | |
| 6,177,712 | B1 | 1/2001 | Miyasaka | |
| 6,207,591 | B1 | 3/2001 | Aoki et al. | |
| 6,229,194 | B1 * | 5/2001 | Lizotte | 257/506 |
| 6,303,986 | B1 * | 10/2001 | Shook | 257/680 |
| 6,320,205 | B1 | 11/2001 | Pfirsch et al. | |
| 6,330,967 | B1 * | 12/2001 | Milewski | B23K 31/02 228/180.22 |
| 6,353,252 | B1 | 3/2002 | Yasuhara et al. | |
| 6,362,495 | B1 | 3/2002 | Schoen et al. | |
| 6,373,076 | B1 | 4/2002 | Alok et al. | |
| 6,410,958 | B1 | 6/2002 | Usui et al. | |
| 6,432,750 | B2 | 8/2002 | Jeon et al. | |
| 6,441,455 | B1 | 8/2002 | Dutta | |
| 6,498,368 | B2 | 12/2002 | Sakamoto et al. | |
| 6,509,240 | B2 | 1/2003 | Ren et al. | |
| 6,514,782 | B1 * | 2/2003 | Wierer et al. | 438/22 |
| 6,562,647 | B2 | 5/2003 | Zandman et al. | |
| 6,573,534 | B1 | 6/2003 | Kumar et al. | |
| 6,573,537 | B1 * | 6/2003 | Steigerwald et al. | 257/103 |
| 6,586,801 | B2 | 7/2003 | Onishi et al. | |
| 6,605,862 | B2 | 8/2003 | Van Dalen et al. | |
| 6,621,122 | B2 | 9/2003 | Qu | |
| 6,622,380 | B1 * | 9/2003 | Grigg | 29/840 |
| 6,624,522 | B2 | 9/2003 | Standing et al. | |
| 6,630,698 | B1 | 10/2003 | Deboy et al. | |
| 6,635,944 | B2 | 10/2003 | Stoisiek | |
| 6,673,662 | B2 | 1/2004 | Singh | |
| 6,674,126 | B2 | 1/2004 | Iwamoto et al. | |
| 6,683,347 | B1 | 1/2004 | Fujihira | |
| 6,700,141 | B2 | 3/2004 | Iwamoto et al. | |
| 6,713,813 | B2 | 3/2004 | Marchant | |
| 6,740,931 | B2 | 5/2004 | Kouzuki et al. | |
| 6,762,455 | B2 | 7/2004 | Oppermann et al. | |
| 6,764,906 | B2 | 7/2004 | Darwish | |
| 6,768,170 | B2 | 7/2004 | Zhou | |
| 6,791,167 | B2 | 9/2004 | Hayashi et al. | |
| 6,812,282 | B2 | 11/2004 | Chang et al. | |
| 6,828,609 | B2 | 12/2004 | Deboy et al. | |
| 6,844,571 | B2 * | 1/2005 | Krames et al. | 257/81 |
| 6,849,900 | B2 | 2/2005 | Aida et al. | |
| 6,897,133 | B2 | 5/2005 | Collard | |
| 6,936,850 | B2 | 8/2005 | Friedrichs et al. | |
| 6,949,454 | B2 | 9/2005 | Swanson et al. | |
| 6,960,829 | B2 * | 11/2005 | Hogerl | 257/737 |
| 6,979,862 | B2 | 12/2005 | Henson | |
| 6,992,340 | B2 | 1/2006 | Tanaka | |
| 7,034,376 | B2 | 4/2006 | Okada et al. | |
| 7,073,890 | B2 * | 7/2006 | Cabal et al. | 347/54 |
| 7,166,890 | B2 | 1/2007 | Sridevan | |
| 7,173,284 | B2 | 2/2007 | Kumar et al. | |
| 7,262,434 | B2 | 8/2007 | Okamura et al. | |
| 7,265,045 | B2 * | 9/2007 | Lee et al. | 438/613 |
| 7,265,388 | B2 | 9/2007 | Fukuda et al. | |
| 7,299,538 | B2 * | 11/2007 | Tactic-Lucic | 29/622 |
| 7,315,081 | B2 * | 1/2008 | Standing | 257/737 |
| 7,394,158 | B2 | 7/2008 | Carta et al. | |
| 7,411,218 | B2 | 8/2008 | Seng et al. | |
| 7,492,003 | B2 | 2/2009 | Kinzer | |
| 7,507,650 | B2 | 3/2009 | Nakamura et al. | |
| 7,649,213 | B2 | 1/2010 | Hatakeyama et al. | |
| 7,687,907 | B2 * | 3/2010 | Okuda et al. | 257/737 |
| 7,718,470 | B2 * | 5/2010 | Hsu | 438/106 |
| 7,777,292 | B2 | 8/2010 | Ota et al. | |
| 7,812,441 | B2 | 10/2010 | Carta et al. | |
| 7,834,376 | B2 | 11/2010 | Carta et al. | |
| 8,368,165 | B2 | 2/2013 | Richieri | |
| 8,368,211 | B2 * | 2/2013 | Standing et al. | 257/736 |
| 8,368,223 | B2 * | 2/2013 | Standing | 257/772 |
| 2001/0043172 | A1 | 11/2001 | McGrath et al. | |
| 2001/0052601 | A1 | 12/2001 | Onishi et al. | |
| 2002/0063281 | A1 | 5/2002 | Tihanyl | |
| 2002/0064930 | A1 * | 5/2002 | Ishikawa | 438/612 |
| 2002/0076851 | A1 * | 6/2002 | Eden et al. | 438/106 |
| 2002/0109211 | A1 | 8/2002 | Shinohara | |
| 2002/0171087 | A1 * | 11/2002 | Krames et al. | 257/81 |
| 2002/0179909 | A1 | 12/2002 | Uchida et al. | |
| 2003/0006425 | A1 | 1/2003 | Bol et al. | |
| 2003/0042538 | A1 | 3/2003 | Kumar et al. | |
| 2003/0075783 | A1 | 4/2003 | Yoshihara et al. | |
| 2003/0119300 | A1 * | 6/2003 | Chiu | H01L 24/03 438/615 |
| 2003/0127747 | A1 * | 7/2003 | Kajiwara et al. | 257/778 |
| 2003/0162355 | A1 | 8/2003 | Sankin et al. | |
| 2003/0168734 | A1 * | 9/2003 | Fang | H01L 23/3114 257/734 |
| 2003/0176031 | A1 | 9/2003 | Onishi et al. | |
| 2003/0183895 | A1 | 10/2003 | Okamura et al. | |
| 2004/0012930 | A1 * | 1/2004 | Grigg | 361/743 |
| 2004/0051118 | A1 * | 3/2004 | Bruhns et al. | 257/200 |
| 2004/0063240 | A1 | 4/2004 | Madrid et al. | |
| 2004/0070060 | A1 * | 4/2004 | Mamitsu et al. | 257/680 |
| 2004/0104489 | A1 | 6/2004 | Larking | |
| 2004/0110330 | A1 | 6/2004 | Collard | |
| 2004/0113264 | A1 * | 6/2004 | Akerling et al. | 257/713 |
| 2004/0135178 | A1 | 7/2004 | Onose et al. | |
| 2004/0145380 | A1 * | 7/2004 | Babcock et al. | 324/679 |
| 2004/0150040 | A1 | 8/2004 | Nitta et al. | |
| 2004/0169262 | A1 | 9/2004 | Oliver et al. | |
| 2004/0207092 | A1 * | 10/2004 | Burrell et al. | 257/758 |
| 2004/0212011 | A1 | 10/2004 | Ryu | |
| 2004/0212093 | A1 * | 10/2004 | Chopra et al. | 257/762 |
| 2004/0245570 | A1 | 12/2004 | Ninomiya | |
| 2004/0262685 | A1 | 12/2004 | Zingg | |
| 2005/0012143 | A1 | 1/2005 | Tanaka et al. | |
| 2005/0023680 | A1 * | 2/2005 | Wang et al. | 257/737 |

(56) References Cited

U.S. PATENT DOCUMENTS

| | | |
|---|---|---|
| 2005/0029557 A1 | 2/2005 | Hatakeyama et al. |
| 2005/0034888 A1* | 2/2005 | Hoffmann et al. .......... 174/52.4 |
| 2005/0067630 A1 | 3/2005 | Zhao |
| 2005/0072984 A1* | 4/2005 | Kwak et al. .................... 257/99 |
| 2005/0077615 A1 | 4/2005 | Yu et al. |
| 2005/0082570 A1 | 4/2005 | Sridevan |
| 2005/0082611 A1 | 4/2005 | Peake et al. |
| 2005/0091988 A1 | 5/2005 | Stewart et al. |
| 2005/0116344 A1* | 6/2005 | Humpston ............. B81B 7/007 257/750 |
| 2005/0136635 A1* | 6/2005 | Savastiouk ............ H01L 23/13 438/597 |
| 2005/0139947 A1 | 6/2005 | Okada et al. |
| 2005/0200011 A1* | 9/2005 | Standing et al. ............. 257/736 |
| 2005/0230715 A1 | 10/2005 | Hoshino et al. |
| 2005/0253168 A1* | 11/2005 | Wu et al. ...................... 257/192 |
| 2006/0003514 A1* | 1/2006 | Richieri ......................... 438/200 |
| 2006/0065899 A1 | 3/2006 | Hatakeyama et al. |
| 2006/0086939 A1 | 4/2006 | Carta et al. |
| 2006/0145283 A1 | 7/2006 | Zhu et al. |
| 2006/0145319 A1* | 7/2006 | Sun ................... H01L 21/6835 257/678 |
| 2006/0214242 A1 | 9/2006 | Carta et al. |
| 2006/0220027 A1 | 10/2006 | Takahashi et al. |
| 2006/0226504 A1 | 10/2006 | Hatakeyama et al. |
| 2006/0255423 A1 | 11/2006 | Ryu et al. |
| 2007/0222025 A1 | 9/2007 | Husain et al. |
| 2007/0228505 A1 | 10/2007 | Mazzola et al. |
| 2008/0237608 A1 | 10/2008 | Richieri |
| 2008/0286968 A1 | 11/2008 | Carta et al. |
| 2009/0067630 A1 | 3/2009 | Daemen et al. |
| 2009/0104738 A1* | 4/2009 | Ring et al. .................... 438/172 |
| 2010/0068855 A1* | 3/2010 | Saxler et al. ................. 438/172 |
| 2011/0248284 A1 | 10/2011 | Carta et al. |
| 2011/0278591 A1 | 11/2011 | Carta et al. |
| 2014/0042459 A1 | 2/2014 | Richieri |

FOREIGN PATENT DOCUMENTS

| | | |
|---|---|---|
| EP | 0604194 | 6/1994 |
| EP | 0681326 A2 | 11/1995 |
| EP | 0958923 A2 | 11/1999 |
| EP | 1349202 | 10/2003 |
| EP | 1739753 | 1/2007 |
| FR | 2579023 | 9/1986 |
| JP | 7302896 | 11/1995 |
| JP | 09-036393 | 2/1997 |
| JP | 11087690 | 3/1999 |
| JP | 11087698 | 3/1999 |
| JP | 11348355 | 12/1999 |
| JP | 2000-022178 | 1/2000 |
| JP | 2001313391 | 11/2001 |
| JP | 2002-118268 | 4/2002 |
| JP | 2002158363 | 5/2002 |
| JP | 2002261295 | 9/2002 |
| JP | 2003074951 | 3/2003 |
| JP | 2003258271 | 9/2003 |
| JP | 2003273127 | 9/2003 |
| JP | 2004079798 | 3/2004 |
| JP | 2004-111759 | 4/2004 |
| JP | 2004099898 | 4/2004 |
| JP | 2004221513 | 8/2004 |
| JP | 2005079339 | 3/2005 |
| JP | 2005-286197 | 10/2005 |
| JP | 2005311347 | 11/2005 |
| JP | 2006-100593 | 4/2006 |
| WO | 3727626 | 7/1997 |
| WO | 0038242 | 6/2000 |
| WO | 0143172 | 6/2001 |
| WO | 03038906 | 5/2003 |
| WO | 2005091988 | 10/2005 |
| WO | 2005093840 | 10/2005 |
| WO | 2006047382 | 5/2006 |
| WO | 2006074382 | 7/2006 |

* cited by examiner

SOLDERABLE TOP METAL FOR SILICON CARBIDE SEMICONDUCTOR DEVICES

CROSS-REFERENCE TO RELATED APPLICATIONS

This is a continuation of U.S. patent application Ser. No. 11/255,021 filed Oct. 20, 2005 and claims the benefit of U.S. Provisional Patent Application No. 60/620,756 filed Oct. 21, 2004, both of which are incorporated herein by reference.

BACKGROUND OF THE INVENTION

Silicon carbide (SiC) is becoming a mature technology for high power devices and is used to fabricate advanced devices such as Schottky diodes, transistor JFETs, and MOSFETs, for example. Notably, SiC devices can be packaged such that wire bonds, for example, connect the electrodes of the device to a device package leadframe. However, to fully exploit the high performance characteristics of a SiC device, device package types are required such that one or more electrodes of the device are electrically and mechanically connected directly to the device package leadframe, for example, or are connected through clips/straps to the device package leadframe, for example. Device packages of these types may include standard solderable packages, flipped SiC packages, clip attach packages, and the DirectFET.RTM. package.

Notably, in order to form these types of direct connections to the electrodes of a SiC device, a conductive adhesive, such as solder or the like, is required. However, one or more electrodes of a SiC device are often formed of a metal, such as aluminum, that does not readily adhere to solder. As such, in order to form a solder-based connection to these electrodes, a solderable contact is often formed directly on the surface of the electrode and the package connection, for example, then made to this solderable contact. As an example, the solderable contact may be an alloy that contains silver.

As is known, the electrodes of a device may be insulated from other surfaces of the device, such as device terminations, by an insulation passivation layer. Notably, forming a reliable passivation layer in conjunction with a solderable contact as just described may be difficult. For example, the metal deposition, cleaning, and etching steps required to form the solderable contact may damage or alter the passivation/termination layer.

In addition, it has been found that under prolonged exposure to electric fields and moisture, silver ions, for example, from a solderable contact can migrate and form dendrites. This migration is referred to as metal electromigration. Notably, when solder is applied to the surfaces of a solderable contact in order to attach an electrode to a device package, for example, the solder will typically dissolve the exposed silver along the surfaces of the contact, forming a solder alloy. As a result, the silver becomes captured within the alloy and cannot migrate from the solderable contact to create dendrites.

However, the passivation layer of a device often overlaps, for example, the edges of the electrodes. As a result, the passivation layer may abut/contact the solderable contact on a given electrode and conceal portions of the outer surfaces of the contact, preventing the silver along these surfaces from being reached during soldering. This silver may be a source of migrating ions, which may migrate over the passivation layer and form dendrites. Over time, these dendrites may damage the passivation layer, reducing device reliability. As an example, the dendrites may form conductive bridges between the device electrodes and the device terminations.

Accordingly, it would be desirable to provide a solderable contact that does not affect the reliability of a SiC device.

SUMMARY OF THE INVENTION

According to an embodiment of the present invention, a SiC device includes at least one power electrode on a top surface of a SiC substrate. The device may be, for example, a Schottky diode. The device also includes a semi insulating passivation layer that overlies the outer peripheral edge, for example, of the power electrode and in particular, may surround the outer peripheral edge of the electrode. In the case of a Schottky diode, this passivation layer may also extend over a termination region that surrounds the power electrode. The passivation layer may be an amorphous silicon layer.

The device further includes a solderable contact deposited on a top surface of the power electrode. The solderable contact may be, for example, a silver-containing contact, such as a trimetal stack containing silver. As an example, the trimetal stack may be a titanium/nickel/silver stack, a chromium/nickel/silver stack, or some other conventional trimetal stack known in the art.

According to an embodiment of the present invention, the solderable contact may be formed such that the edge/side of the solderable contact is a spaced distance from the confronting/adjacent edge/side of the amorphous silicon passivation layer, thereby forming a gap/opening between the solderable contact and the passivation layer. This gap preferably extends vertically to the top surface of the electrode and in addition, preferably surrounds the outer periphery of the solderable contact. Hence, if the electrode is made of aluminum for example, the gap forms an aluminum frame around the solderable contact. The gap may be from about 5 um to about 80 um wide and preferably, may be about 10 um wide.

According to an embodiment of the present invention, when solder is applied to the solderable contact to connect the contact to a device package leadframe or clip/strap for example, the gap assists in containing the solder inside the area of the solderable contact as the solder is reflowed. Hence, if the device includes a surrounding termination region, for example, the gap helps to prevent the solder from extending into the termination region. In addition, the gap also exposes the entire top and side surfaces of the solderable contact, thereby preventing the amorphous silicon passivation layer from concealing any of the surfaces of the contact. As a result, as solder is applied to the solderable contact and reflowed, the solder is able to cover the entire outer exposed surface of the solderable contact and thereby dissolve the exposed silver along these surfaces and form a solder alloy. In this way, the silver is fully captured within the alloy, limiting the effect of silver ion electromigration and the formation of dendrites over the passivation layer.

According to another embodiment of the present invention, a second insulating passivation layer is formed over the top surface of the amorphous silicon passivation layer and in particular, preferably extends from the above mentioned gap to the outer end/edge of the amorphous silicon passivation layer. According to a further aspect of the invention, the second passivation layer may extend beyond the outer end/edge of the amorphous silicon passivation layer. This second passivation layer may be added in cases of high roughness and for reliability needs and may be a photo imagable polyimide layer, a PSG (phosphor silicate glass) oxide layer, or a silicon nitride layer, for example. According to the present invention, the edge/side of the solderable contact and the confronting/adjacent edge/side of the second passivation layer act to further define the gap.

According to an embodiment of the present invention, the second passivation layer preferably has a thickness such that the top surface of the passivation layer at least has the same height as the top surface of the solderable contact in the area of the gap. In this way, the gap and the side/edge of the second passivation layer further assist in containing the solder inside the area of the solderable contact as the solder is reflowed, as described above.

A semiconductor device according to the present invention may be fabricated using substantially the same process steps used to form a comparable device that is packaged using wire bonds (i.e., a bondable device) for example, thereby making the fabrication of a device of the present invention compatible with current SiC processing steps. For example, if fabricating a SiC Schottky diode, the Schottky contact, anode electrode, device termination, and amorphous silicon passivation layer over the device termination may be formed using process steps used to fabricate a bondable device. Thereafter, a solderable top metal may be applied over the top surface of the device and etched to form the solderable contact and surrounding gap of the present invention. If device reliability/roughness is an issue, the second passivation layer may then be formed over the amorphous silicon passivation layer.

Notably, a device, such as a Schottky diode, according to the present invention may have different forms of terminations including different forms of field plates, guard rings (e.g., single, multiple, and floating), and JTE terminations, for example. In addition, the present invention is capable of reliably providing a robust termination and passivation for SiC devices from about 300V up to about 1600V.

Other features and advantages of the present invention will become apparent from the following description of the invention which refers to the accompanying drawings.

DETAILED DESCRIPTION OF THE INVENTION

Figure 1A:
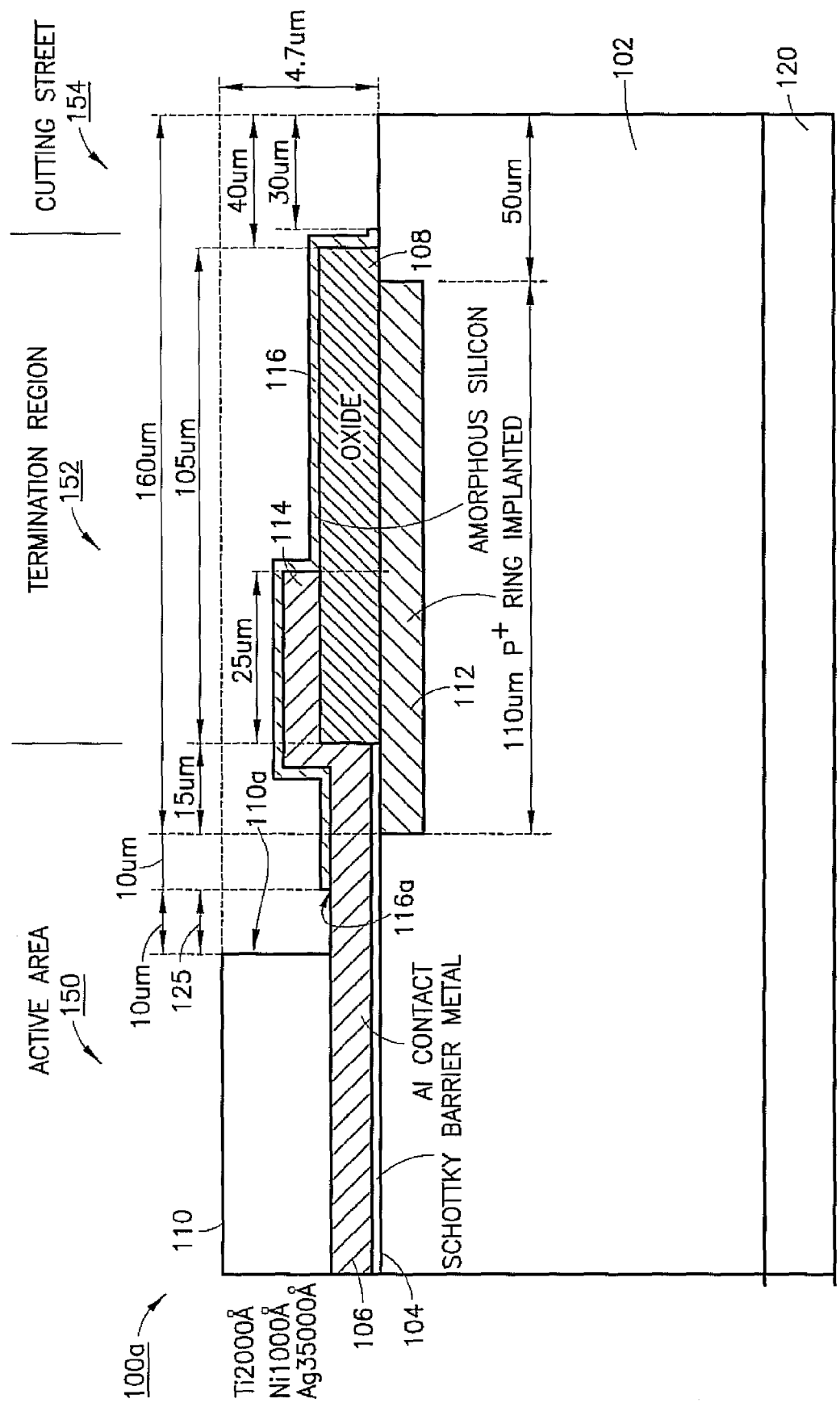
FIG. 1A shows a cross-sectional view of a portion of a semiconductor device according to an embodiment of the invention.

This invention relates generally to semiconductor devices, and more specifically, to a solderable contact for silicon carbide semiconductor devices. Referring to FIG. 1A, there is shown in cross section a small portion of a semiconductor device 100a according to a preferred embodiment of the present invention (note that the dimensions shown in FIG. 1A are for example purposes and that device 100a is not drawn to scale). As an example, device 100a is a SiC Schottky diode with a single ring field plate termination and a blocking voltage of about 600V, and may be a 6 Angstrom device with a die size of about 1450×1450 um. Nonetheless, one skilled in the art will recognize that the present invention is not limited to SiC Schottky diodes and is not limited to these dimensions.

As shown in FIG. 1A, device 100a includes a SiC substrate 102. As an example, substrate 102 may have the following parameters, although one skilled in the art will recognize that the invention is not limited to these parameters: Cs bulk 0.019 ohm/cm=3E18 Tx 350.mu.; Epi 7 um. concentration doping 9E15 dopant type nitrogen; and Epi 7 um. On the top surface of substrate 102 along active area 150 is a Schottky barrier metal 104, made of titanium for example, which forms a Schottky contact with substrate 102. As an example, device 100a may have a Ti barrier length of 1.01 eV. Formed over Schottky barrier metal 104 is contact metal 106. This contact metal may be made of aluminum, for example, and may have a thickness of 1 um, for example. Contact metal 106 forms the anode power electrode of device 100a and acts as a diffusion barrier that protects Schottky barrier metal 104 from interactions from other metals, such as solderable contact 110.

A termination region 152 surrounds the periphery of active area 150 and includes a field oxide ring 108 formed along the top surface of substrate 102, which oxide ring may have a thickness of about 7000 Angstrom for example. Termination region 152 further includes a guard ring 112 of P+ conductivity formed within the top surface of substrate 102. The guard ring extends along field oxide ring 108 and under a portion of Schottky barrier metal 104. As shown in FIG. 1A, a portion of contact metal/anode electrode 106 extends within termination region 152 and over a portion of the top surface of field oxide ring 108, thereby forming field plate 114. A semi insulating passivation layer 116 overlies the exposed top and side surfaces of field oxide ring 108 and field plate 114. Passivation layer 116 also extends over the outer peripheral edge of anode power electrode 106 and in this way, surrounds the outer peripheral edge of the electrode. Passivation layer 116 may have a thickness of about 1900 Angrstom, for example, and may be an amorphous silicon layer, for example.

Along the bottom surface of substrate 102 is a conventional contact metal 120 that forms a cathode electrode.

Device 100a further includes a solderable contact 110 that is deposited on a top surface of the anode electrode 106 and that may extend, for example, about 4.7 um above the top surface of substrate 102. This solderable contact may be, for example, a silver-containing contact, such as a trimetal stack containing silver. As an example, the trimetal stack may be a titanium/nickel/silver stack each with a respective thickness of about 2000 Angstrom, 1000 Angstrom, and 35000 Angstrom, for example. Alternatively, the trimetal stack may be a chromium/nickel/silver stack, or some other conventional trimetal stack known in the art.

Figure 1B:
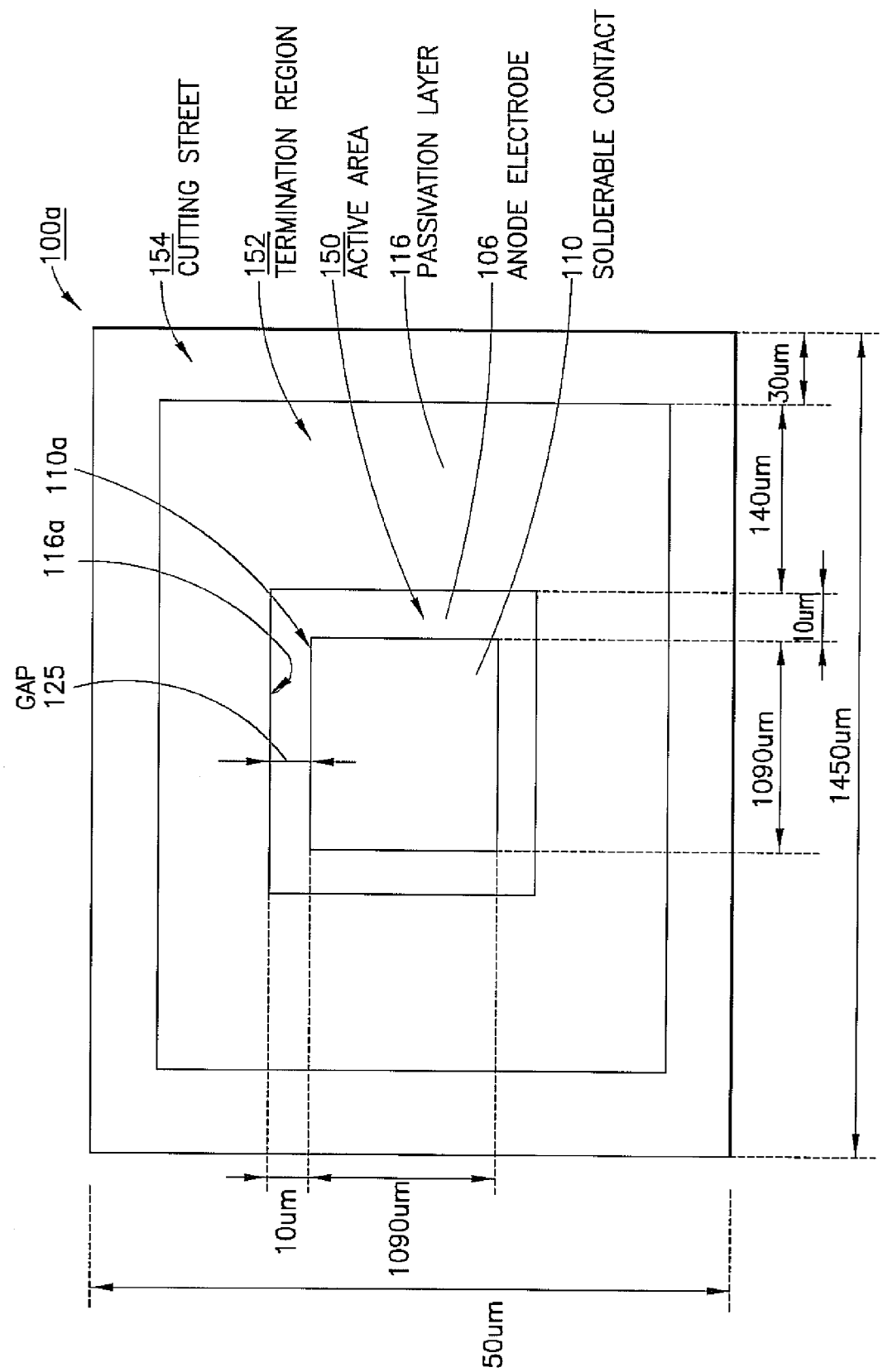
FIG. 1B shows a top plan view of the semiconductor device of FIG. 1A, with FIG. 1B showing the complete top surface of the device.

According to an embodiment of the present invention and as shown in FIG. 1A, solderable contact 110 may be formed such that the edge/side 110a of the solderable contact is a spaced distance from the confronting/adjacent edge/side 116a of passivation layer 116, thereby forming a gap/opening 125 therebetween. Gap 125 preferably extends vertically to the top surface of anode electrode 106, thereby exposing the top surface and the aluminum thereof, assuming the electrode is made of aluminum. As shown in FIG. 1B, which shows a top view of the entire top surface of device 100a, gap 125 preferably surrounds the outer periphery of solderable contact 110, thereby forming, for example, an aluminum frame around the solderable contact (note that the dimensions shown in FIG. 1B are for example purposes). Gap 125 may be from about 5 um to about 80 um wide and preferably, may be about 10 um wide.

Significantly, when solderable contact 110 of device 100a is attached by solder to a clip/strap or a leadframe of a device package, for example, gap 125 assists in containing the solder inside the area of the solderable contact as the solder is reflowed, thereby preventing the solder from extending into termination region 152. In addition, gap 125 exposes the entire top and side surfaces of solderable contact 110, thereby preventing passivation layer 116 from concealing any of the surfaces of the solderable contact. As a result, as solder is applied to the solderable contact and reflowed, the solder is able to cover the entire outer exposed surface of the solderable contact and thereby dissolve the exposed silver along these surfaces and form a solder alloy. In this way, the silver is fully captured within the alloy, limiting the effect of silver ion electromigration and the formation of dendrites over passivation layer 116.

Figure 1C:
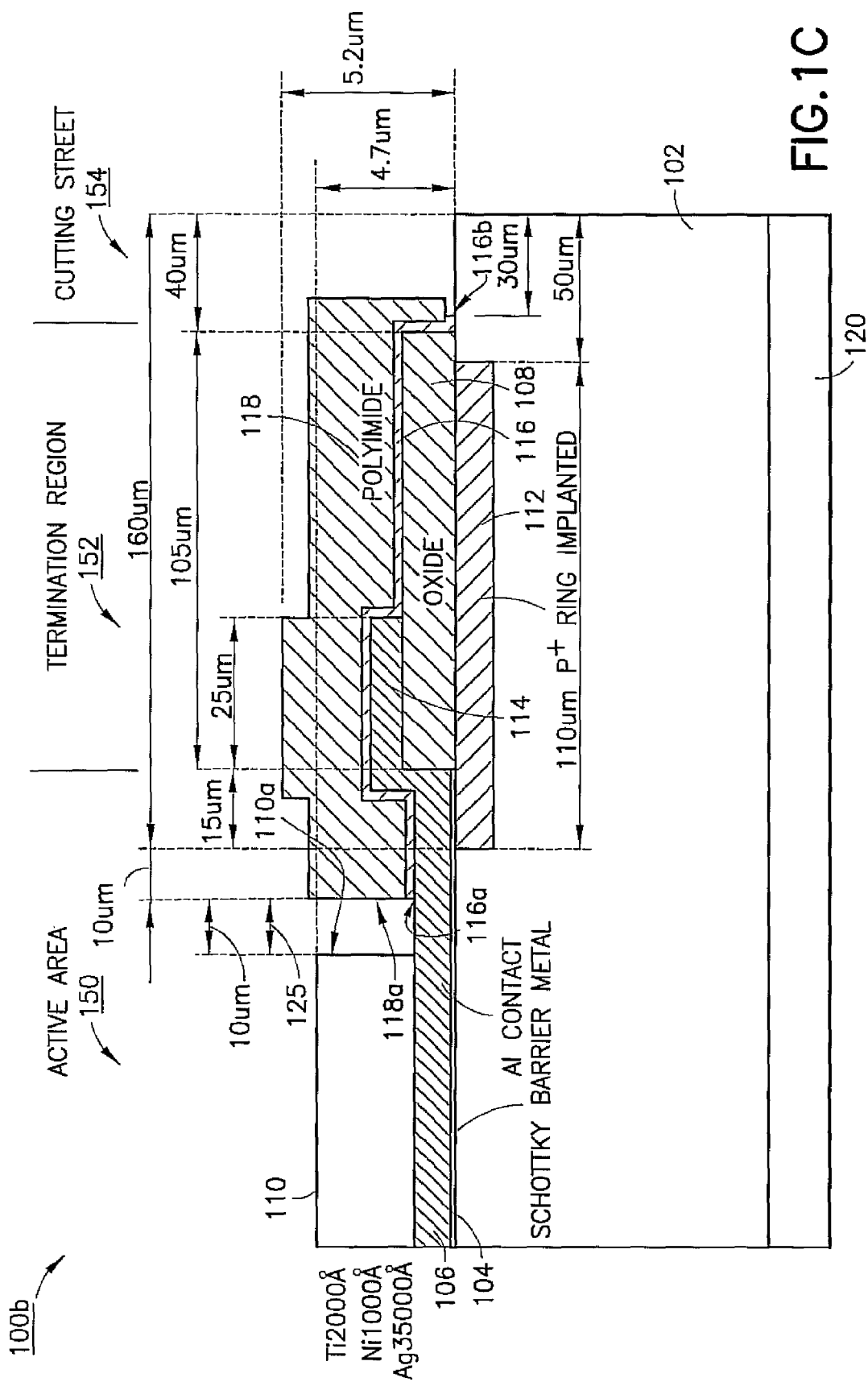
FIG. 1C shows a cross-sectional view of a portion of a semiconductor device according to another embodiment of the invention.

Referring now to FIG. 1C in which like numerals identify like features, there is shown in cross section a portion of a semiconductor device 100b according to an embodiment of the present invention. Device 100b is similar to device 100a and now further includes a second insulating passivation layer 118 formed over passivation layer 116. In particular, passivation layer 118 extends from side/edge 116a of passivation layer 116 along the full length thereof. Alternatively and as shown in FIG. 1C, passivation layer 118 may extend beyond the end 116b of passivation layer 116 and into cutting street 154, for example, in order to seal the entire termination layer, for example. Passivation layer 118 may be added in cases of high roughness and for reliability needs. Passivation layer 118 may have a thickness of about 3 um substantially over the length thereof, for example, and may be a photo imagable polyimide layer, a PSG (phosphor silicate glass) oxide layer, or a silicon nitride layer, for example, depending on the device application and/or device reliability requirements. According to an embodiment of the invention and as shown in FIG. 1C, the edge/side 118a of passivation layer 118 that is adjacent to side/edge 110a of solderable contact 110 acts to further define gap 125.

The thickness or height of passivation layer 118 is based on the passivation quality of the material from which the layer is formed and on the blocking voltage of the device. Preferably, however, passivation layer 118 has a thickness such that the top surface of the passivation layer at least has the same height as the top surface of solderable contact 110 in the area of gap 125, as shown in FIG. 1C. In this way, gap 125 and side/edge 118a of passivation layer 118 further assist in containing the solder inside the area of the solderable contact 110 as the solder is reflowed, thereby preventing the solder from extending into the termination region.

Figure 2A:
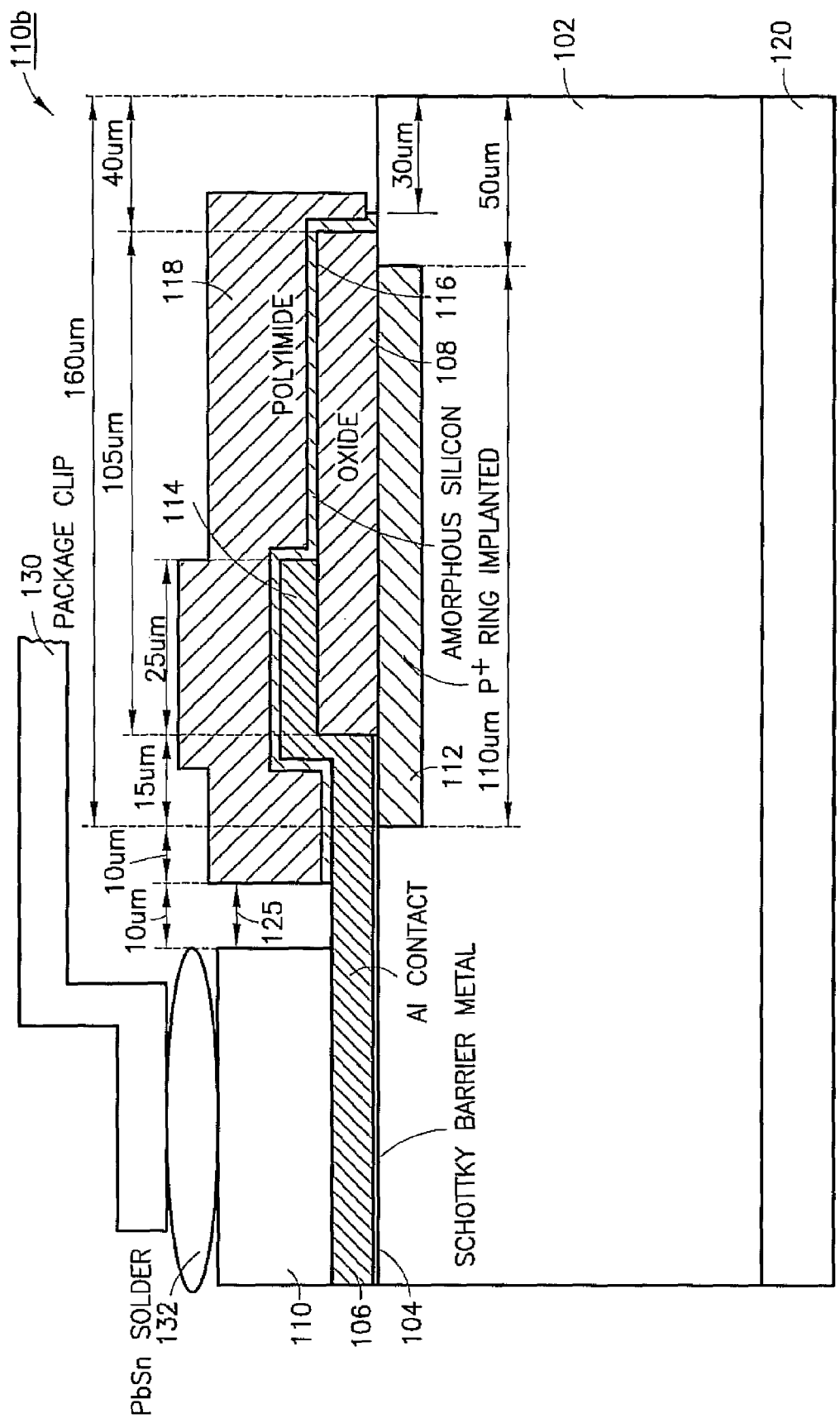
FIGS. 2A and 2B show process steps according to an embodiment of the invention for attaching a package clip to a power electrode of the semiconductor device of FIG. 1C.
Figure 2B:
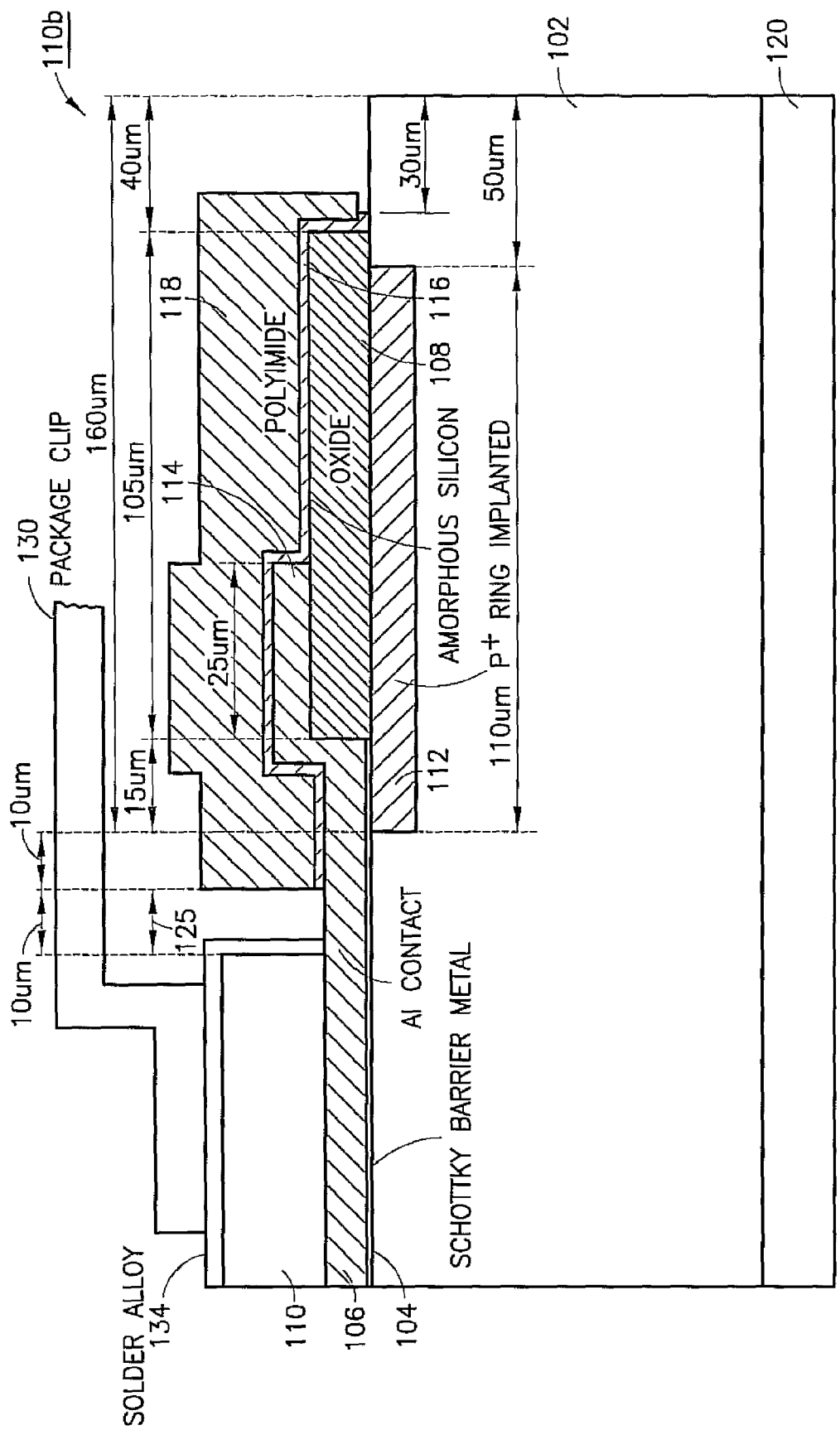

In general, the present invention is applicable to all cases where a solderable contact is needed. For example, referring to FIGS. 2A and 2B, there is shown a clip/strap 130 secured to solderable contact 110 of device 100b according to an embodiment of the invention (note that a clip/strap would be similarly secured to device 100a). Clip/strap 130 may connect anode electrode 106 to the leadframe of a device package, such as a TO220 clip attach package, for example (note that FIG. 1C does not show the interconnection between the clip and leadframe). As shown in FIG. 2A, solder paste 132, for example, is first placed on solderable contact 110 and clip 130 is then placed directly on the surface of the solderable contact. Thereafter, the solder is reflowed to attach the clip to the solderable contact, as shown in FIG. 2B. As illustrated in this Figure and as described above, as the solder is reflowed, the solder covers the entire outer exposed surface of solderable contact 110, thereby dissolving the exposed silver along these surfaces and forming a solder alloy 134 that helps to prevent the formation of dendrites.

As another example, for a package with a top side leadframe, the leadframe may be placed directly on solderable contact 110 in a similar fashion as shown in FIG. 2A and secured in a similar fashion as shown in FIG. 2B. As a further example, for device packages whereby the SiC die is flipped-chip mounted to a substrate, for example, solderable contact 110 may be placed directly on the pads of the substrate and soldered thereto.

A semiconductor device according to the present invention may be fabricated using substantially the same process steps used to form a comparable device that is packaged using wire bonds (i.e., a bondable device) for example, thereby making the fabrication of a device of the present invention compatible with current SiC processing steps. For example, referring to FIG. 3A, there is shown a partially fabricated SiC Schottky diode that resembles devices 100a and 100b. If a bondable form of the diode is required, the device is completed by applying a contact metal 120 on the bottom surface of the device to form a cathode electrode. Alternatively, several additional fabrication steps may be performed in order to form solderable contact 110 and optionally, passivation layer 118 of the present invention.

Figure 3A:
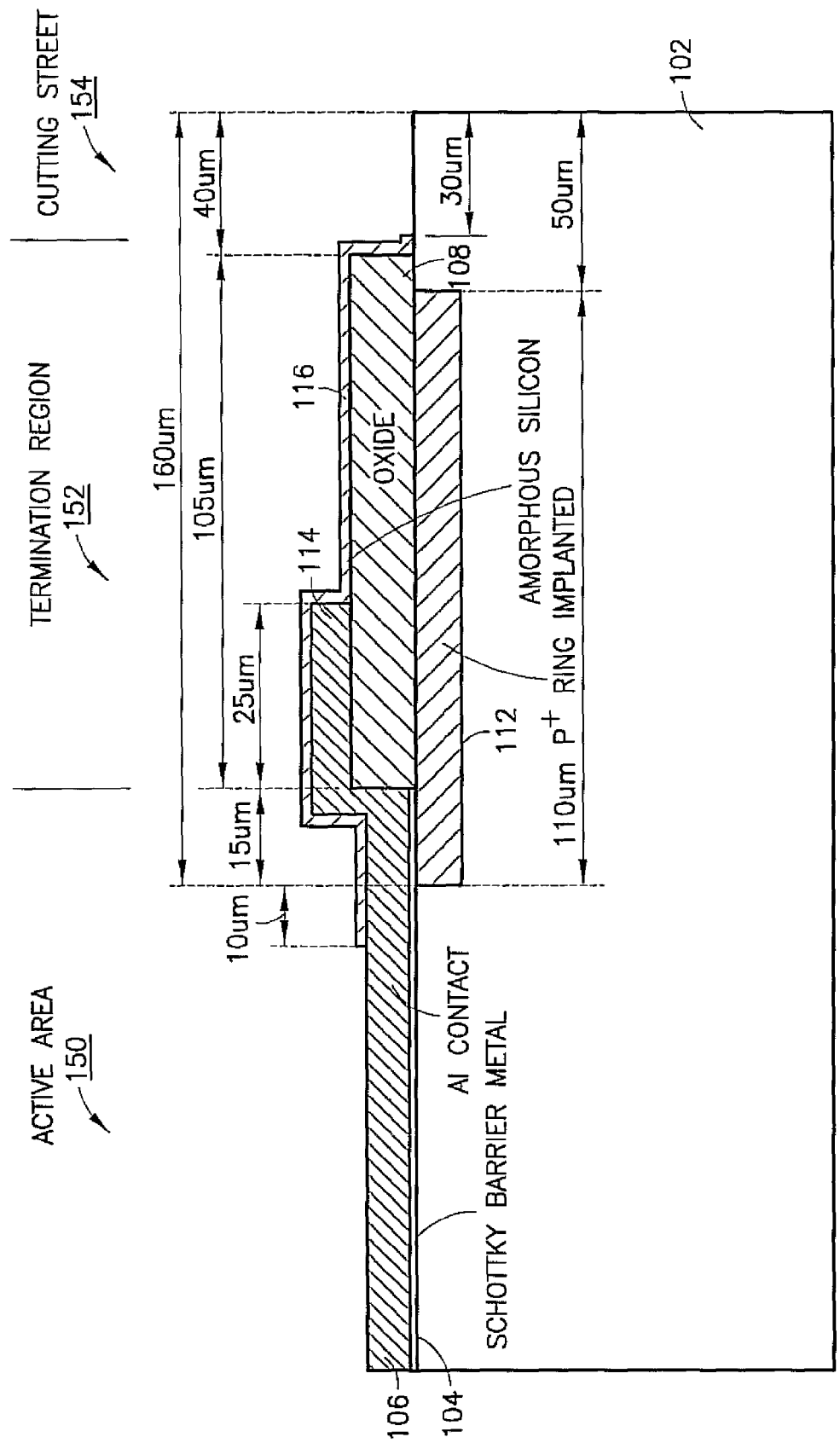
FIGS. 3A, 3B, and 3C illustrate a process according to an embodiment of the invention for fabricating the semiconductor devices of FIGS. 1A and 1C.

In overview and as an example, the device of FIG. 3A may be fabricated according to the following process. First, an oxide-based mask, for example, is formed on the top surface of a SiC substrate 102, which mask has an opening therein along a portion of the termination region 152 and active area 150 to expose the top surface of the substrate. Thereafter, a boron implant, for example, is performed on the top surface of the substrate through the opening. A phosphorus implant, for example, is then performed along the bottom surface of the substrate. Thereafter, the mask on the top surface of the substrate is removed and the boron and phosphorous implants are annealed. As a result, guard ring 112 of P.sup.+ conductivity is formed in the top surface of the substrate and the bottom surface becomes highly doped, thereby allowing an ohmic contact to be formed when contact metal 120 is deposited on the bottom surface.

Next, a layer of LTO TEOS, for example, is deposited on the top surface of substrate 102 and is thereafter masked and etched to form field oxide ring 108. Next, a Schottky barrier metal layer 104, such as titanium, and a contact metal layer 106, such as aluminum, are deposited on the top surface of the device and are thereafter sintered, forming a Schottky contact along the active area 150. Thereafter, the Schottky barrier metal layer and the contact metal layer are masked and then etched along the termination region 152 and cutting street 154 and the mask then removed, thereby forming anode electrode 106 and field plate 114.

Next, a passivation layer, such as amorphous silicon, is applied over the top surface of the device. The amorphous silicon layer is then masked and etched along the active area and cutting street and the mask then removed. Thereafter, the amorphous silicon is sintered, resulting in the formation of passivation layer 116 and thereby the device shown in FIG. 3A. Again, if a bondable form of the device is required, the device is completed by forming a cathode electrode on the bottom surface thereof. Alternatively, solderable contact 110 and optionally, passivation layer 118, of the present invention may be formed using, for example, the following additional process steps.

Figure 3B:
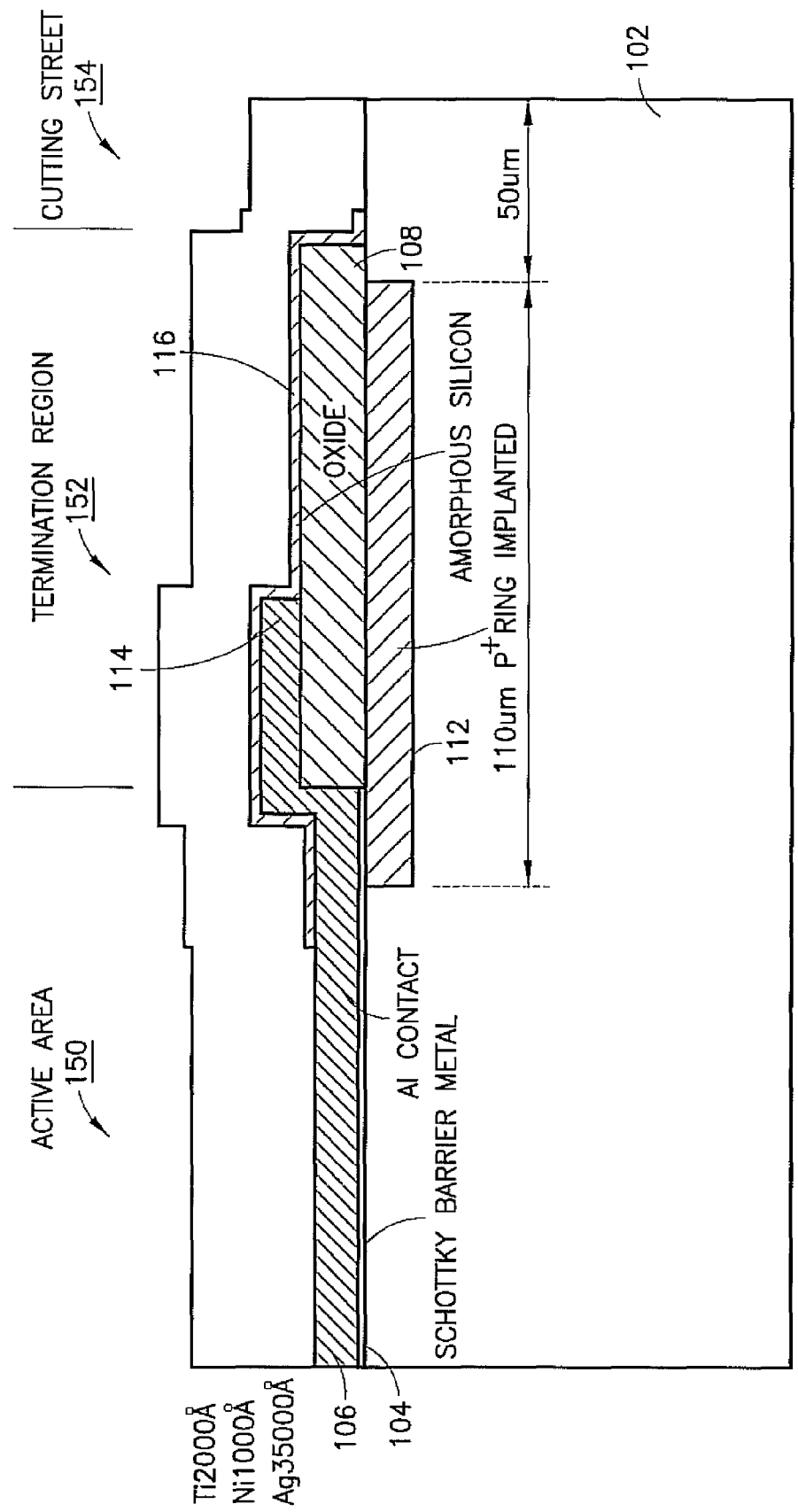

Referring to FIG. 3B, a solderable top metal 136 is applied over the top surface of the device shown in FIG. 3A. Again, this solderable top metal may be a silver-containing trimetal stack, such as a titanium/nickel/silver stack each with a respective thickness, for example, of about 2000 Angstrom, 1000 Angstrom, and 35000 Angstrom. Next, a mask (not shown in the Figures) is formed over the surface of the solderable top metal using photolithography, for example, and the metal then etched, removing the metal from the termination region and cutting street and forming solderable contact 110. During the etching process, gap 125 is also formed, separating the solderable contact and passivation layer 116 by a spaced distance. The remaining mask layer over solderable contact 110 is then removed, resulting in the device shown in FIG. 3C. Again, gap 125 preferably extends to the surface of anode electrode 106 and preferably surrounds the periphery of solderable contact 110.

Figure 3C:
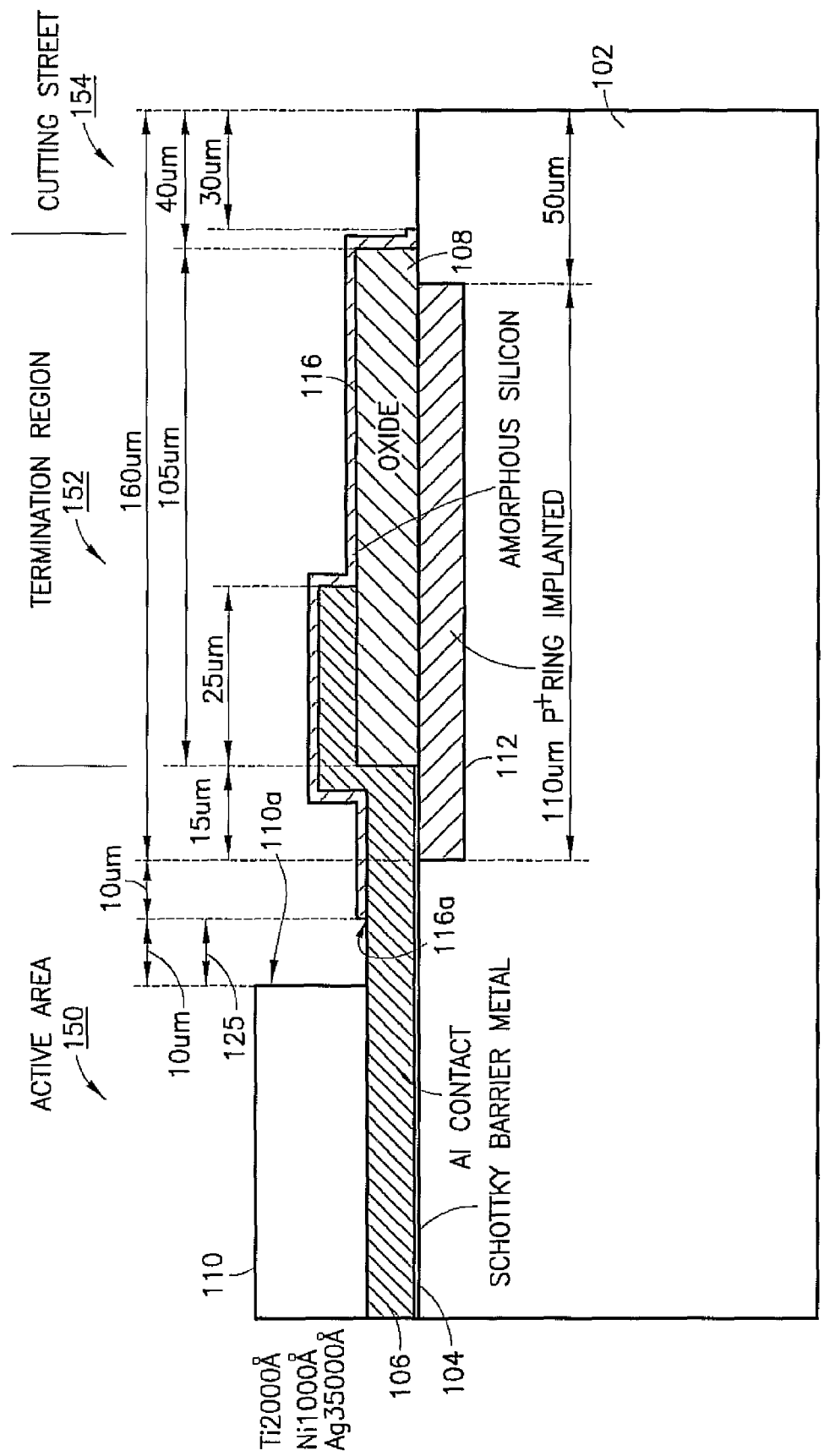

To form device 100a of FIG. 1A, for example, a back side contact metal 120 is finally applied along the bottom surface of the device of FIG. 3C, thereby forming a cathode electrode.

Alternatively, if device reliability/roughness is an issue as described above, a second passivation layer 118 may be formed over the first passivation layer 116, resulting in device 100b of FIG. 1C, for example. Passivation layer 118 may be a photo imagable polyimide layer, a PSG oxide layer, or a silicon nitride layer, for example. Assuming passivation layer 118 is made of photopolyimide, layer 118 is formed by first depositing the photopolyimide over the surface of the device shown in FIG. 3C. A mask is then formed over the surface of the deposited photopolyimide and the photopolyimide layer etched along the active area and cutting street, removing the photopolyimide from the surface of the solderable contact 110, from gap 125, and from cutting street 154, thereby forming passivation layer 118 as shown in FIG. 1C. Passivation layer 118 may extend the full length of passivation layer 116 or may extend beyond the end 116b of passivation layer 116 and into the cutting street, for example. In addition, passivation layer 118 preferably has a thickness such that the top surface of the passivation layer at least has the same height as the top surface of solderable contact 110 in the area of gap 125, as shown in FIG. 1C. However, this thickness is not required and is a function of the passivation material and the blocking voltage of the device, as described above.

To complete device 100b, a back side contact metal 120 is applied along the bottom surface of substrate 102.

As can be seen, the fabrication process for a solderable contact and a second passivation layer of the present invention is compatible with existing SiC process fabrication steps.

One skilled in the art will recognize that a device according to the present invention is not limited to a Schottky diode with a single ring field plate termination, as described above, and is also applicable to Schottky diodes with different forms of field plates, guard rings (e.g., single, multiple, and floating), and JTE terminations, for example. In addition, the present invention is not limited to a 600V device and in particular, is capable of reliably providing a robust termination and passivation for SiC devices from about 300V up to about 1600V. For example, referring to FIGS. 4A-4E, in which like numerals identify like features, there are shown SiC Schottky diodes 400a-400e according to embodiments of the present invention, each diode having an alternative termination (note that the dimensions shown in FIG. 4A-4E are for example purposes and that devices 400a-400e are not drawn to scale). Similar to devices 100a and 100b, devices 400a-400e each has a solderable contact 110 and a gap 125 formed between this contact and adjacent passivation layers 116 and 118. Note that while devices 400a-400e are shown as including passivation layer 118, this passivation layer is not required.

Figure 4A:
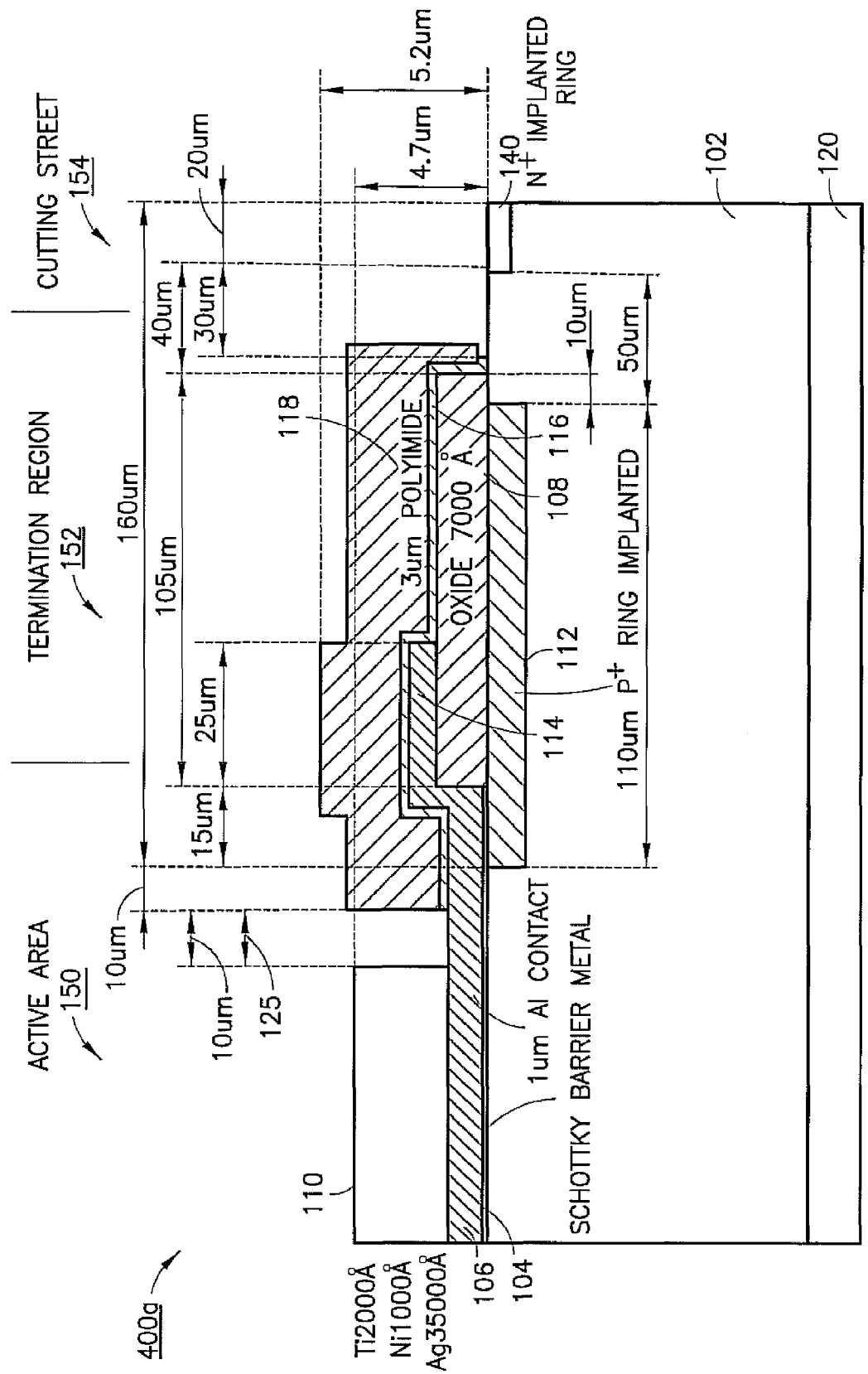
FIGS. 4A, 4B, 4C, 4D, and 4E show cross-sectional views of portions of semiconductor devices according to embodiments of the invention, the devices of FIGS. 4A, 4B, 4C, 4D, and 4E having different terminations.
Figure 4B:
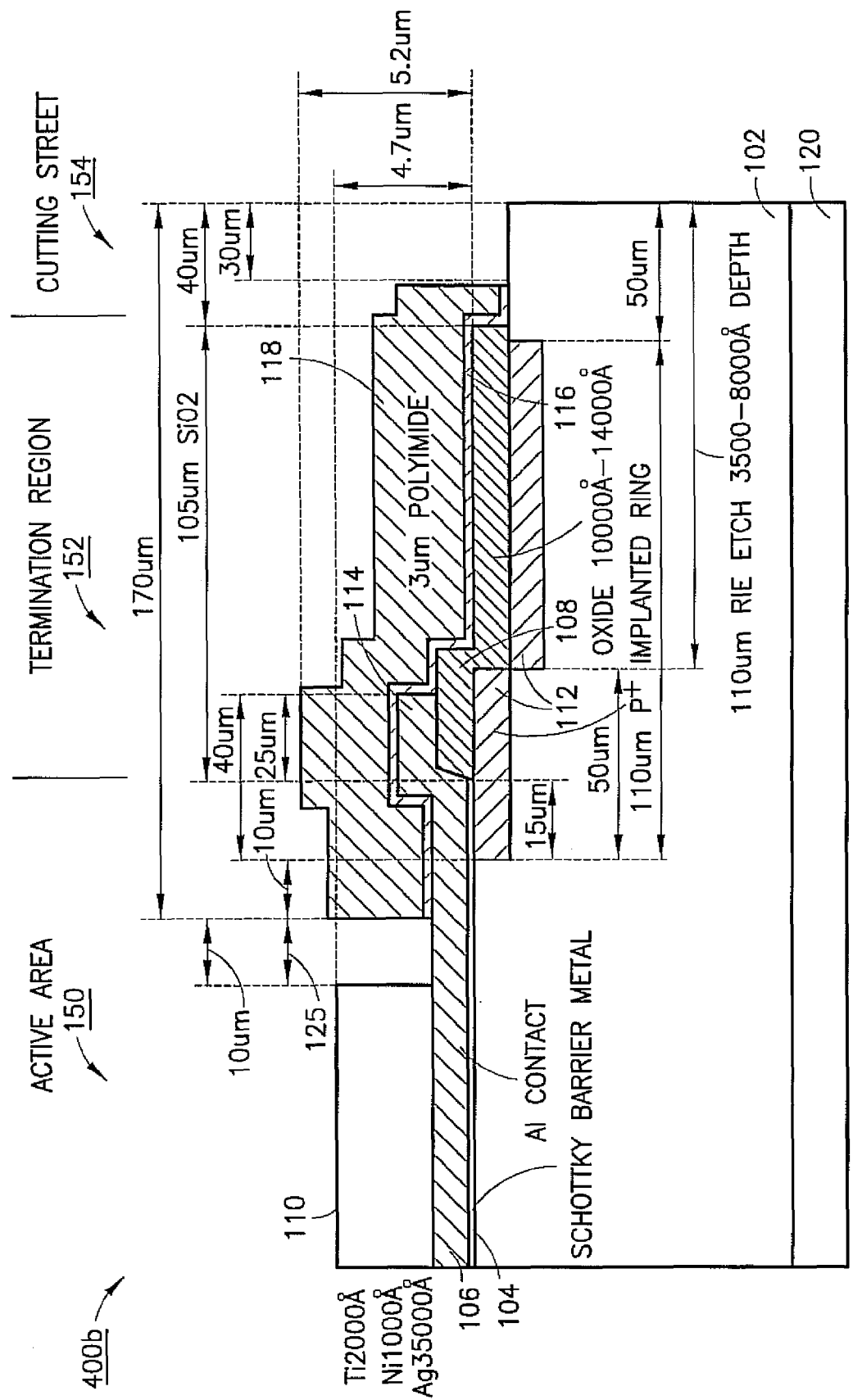
Figure 4C:
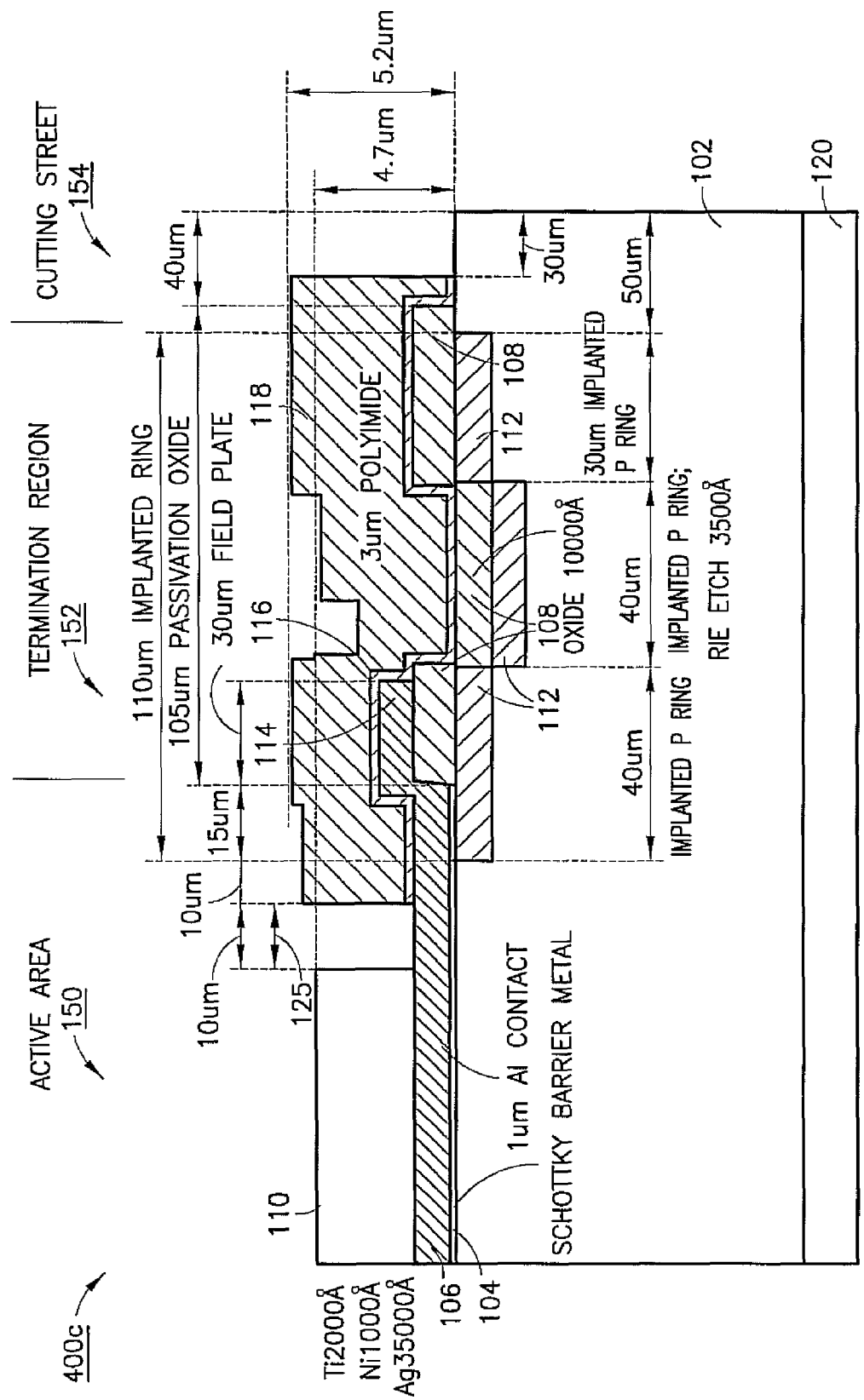
Figure 4D:
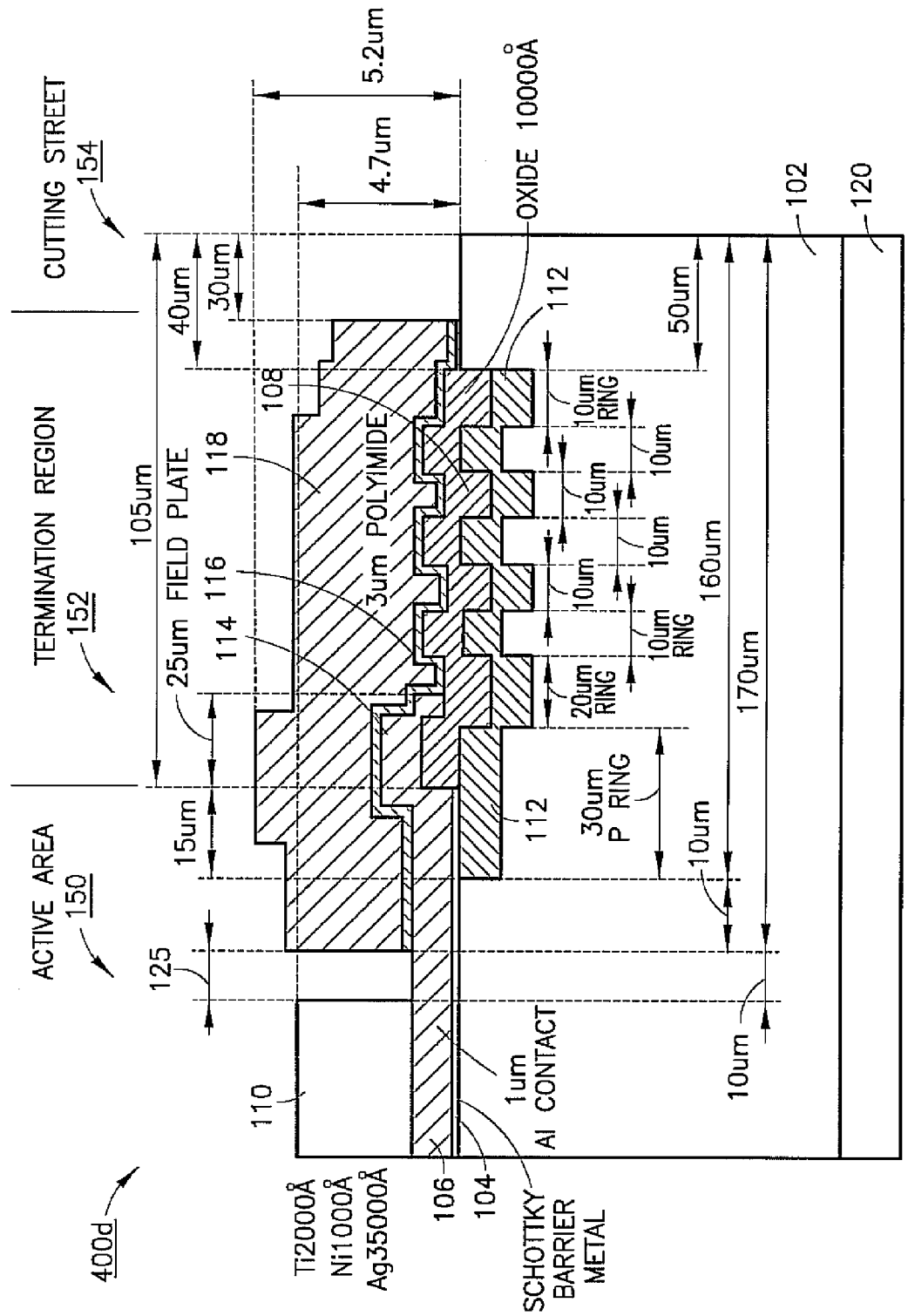
Figure 4E:
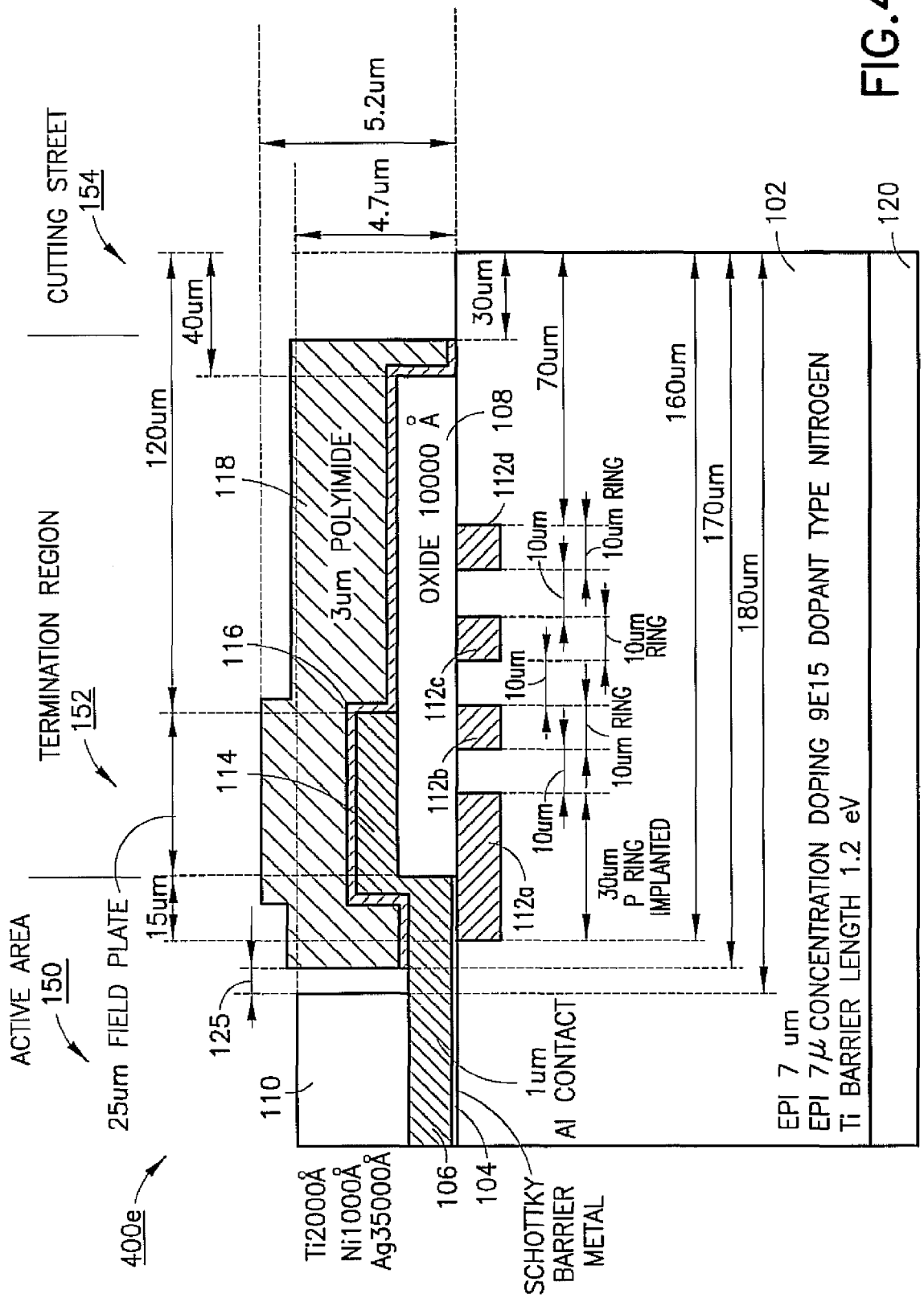

In overview, device 400a of FIG. 4A is similar to device 100b, for example, but now further includes an N.sup.+ diffusion 140 that laterally surrounds the die edge along cutting street 154. Devices 400b, 400c, and 400d of FIGS. 4B, 4C, and 4D include multiple stepped field oxide rings 108 and multiple stepped guard rings 112 of P.sup.+ conductivity, for example. Device 400e of FIG. 4E has a single field oxide ring 108 and multiple guard rings 112a-d, with rings 112b-d being floating guard rings.

One skilled in the art will also recognize that solderable contact 110, gap 125, and passivation layer 118 of the present invention are not limited to SiC Schottky diodes and are also applicable to other SiC power devices, such as MOSFETs. In addition, the present invention is also applicable to both vertical and lateral conduction devices. As an example, for a MOSFET with two or more electrodes on a top surface thereof, each electrode may include a solderable contact 110 of the present invention, with each solderable contact being spaced from an adjacent passivation layer(s) by a gap 125.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of forming a semiconductor device comprising:
    forming an electrode on a semiconductor substrate;
    forming a passivation layer on the semiconductor substrate and disposed on an outer peripheral edge of the electrode; and
    forming a solderable contact on the electrode spaced apart from the passivation layer to form a gap between the passivation layer and the solderable contact,
wherein the gap exposes a surface of the electrode between the passivation layer and the solderable contact.

2. The method according to claim 1, wherein the semiconductor substrate comprise silicon carbide.

3. The method according to claim 2, wherein the solderable contact comprises silver.

4. The method according to claim 3, wherein the solderable contact comprises a trimetal stack including the silver.

5. The method according to claim 4, further comprising applying a solder layer to the solderable contact.

6. The method according to claim 5, further comprising reflowing the solder layer to couple a leadframe, clip or strap to the solderable contact.

7. The method according to claim 5, wherein the gap prevents the solder from extending to the passivation layer as the solder is reflowed.

8. The method according to claim 7, wherein reflowing the solder dissolves exposed silver along the surfaces of the solderable contact to form a solder alloy.

9. The method according to claim 8, wherein the silver is captured in the solder alloy to reduce silver ion electromigration.

10. The method according to claim 8, wherein the silver is captured in the solder alloy to reduce formation of dendrites over the passivation layer.

11. The method according to claim 8, further comprising forming a second passivation layer on the passivation layer spaced apart from the sides and edges of the solderable contact to further form the gap between the second passivation layer and the solderable contact.

12. The method according to claim 11, wherein:
the passivation layer comprises an amorphous silicon; and
the second passivation layer comprises a polyimide, a phosphor silicate glass oxide or a silicon nitride.

13. A method of forming a semiconductor device comprising:
forming an electrode on a silicon carbide substrate;
forming a passivation layer on the substrate and disposed on an outer peripheral edge of the electrode; and
forming a solderable contact including silver on the electrode, spaced apart from the passivation layer to form a gap that separates the passivation layer from the solderable contact, wherein the gap surrounds the periphery of the solderable contact.
applying a solderable metal layer over the top surface of the device; and
etching the solderable metal layer to form solderable contact on the electrode within the gap.

14. The method according to claim 13, further comprising:
applying solder to the solderable contact;
reflowing the solder to couple the solderable contact to a leadframe, clip or strap.

15. The method according to claim 14, wherein the gap contains the solder inside the area of the solderable contact as the solder is reflowed.

16. The method according to claim 14, wherein the gap prevents the solder from extending into the termination region as the solder is reflowed.

17. The method according to claim 14, wherein the gap exposes the top and side surfaces of the solderable contact to prevent the passivation layer from concealing the top and side surfaces of the solderable contact.

18. The method according to claim 14, wherein reflowing solder dissolves exposed silver along the surfaces of the solderable contact to form a solder alloy.

19. The method according to claim 18, wherein the silver is captured in the solder alloy to reduce silver ion electromigration.

20. The method according to claim 18, wherein the silver is captured in the solder alloy to reduce formation of dendrites over the passivation layer.

* * * * *